United States Patent [19]
Mangelsdorf

[11] Patent Number: 5,436,629
[45] Date of Patent: * Jul. 25, 1995

[54] MULTI-STAGE A/D CONVERTER

[75] Inventor: Christoper W. Mangelsdorf, Reading, Mass.

[73] Assignee: Analog Devices, Inc., Norwood, Mass.

[*] Notice: The portion of the term of this patent subsequent to May 11, 2010 has been disclaimed.

[21] Appl. No.: 31,565

[22] Filed: Mar. 16, 1993

Related U.S. Application Data

[62] Division of Ser. No. 907,526, Jul. 2, 1992, Pat. No. 5,210,537, which is a division of Ser. No. 652,583, Feb. 8, 1991, Pat. No. 5,184,130.

[51] Int. Cl.⁶ .............................................. H03M 1/36
[52] U.S. Cl. ...................................... 341/156; 341/159
[58] Field of Search .............. 341/156, 155, 157, 158, 341/159, 162, 139

[56] References Cited

U.S. PATENT DOCUMENTS

| | | | |
|---|---|---|---|
| 4,270,118 | 5/1981 | Brokaw | 340/347 AD |
| 4,814,767 | 3/1989 | Fernandes et al. | 341/158 |
| 4,894,657 | 1/1990 | Hwang et al. | 341/158 |
| 5,184,130 | 2/1993 | Mangelsdorf | 341/156 |
| 5,210,537 | 5/1993 | Mangelsdorf | 341/156 |

Primary Examiner—Brian K. Young
Attorney, Agent, or Firm—Parmelee, Bollinger & Bramblett

[57] ABSTRACT

An analog-to-digital converter (ADC) having two cascaded A/D stages of the parallel type wherein the analog signal is compared with a set of threshold reference voltages. The first stage develops a set of most-significant bits and produces two analog residue signals: a normal residue corresponding to the difference between the analog input and the threshold voltage below the analog input, and a second residue corresponding to the difference between the analog input and the threshold voltage above the analog signal level. These two residue signals are amplified and directed to the second A/D stage. The sum of the residue signals equals one LSB of the first A/D stage, so that the two residues supply to the second stage information about the quantization error of the previous stage as well as the quantization step size to be used to define full-scale at the second stage. The second A/D stage includes a parallel converter for developing a set of less-significant bits representing the ratio of the normal residue signal to the sum of the two residue signals. The most-significant and less-significant sets of bits are combined to provide the final digital output. Errors due to inaccuracies in interstage gain are reduced due to the use of two residue signals for generating the less-significant bits.

11 Claims, 8 Drawing Sheets

MULTI-STAGE A/D CONVERTER

This application is a division of U.S. Ser. No. 907,526 filed Jul. 2, 1992, now U.S. Pat. No. 5,210,537 which is a division of U.S. Ser. No. 652,583 as originally filed on Feb. 8, 1991, now U.S. Pat. No. 5,184,130.

BACKGROUND OF THE INVENTION

1. Field of the Invention

This invention relates to analog-to-digital converters. More particularly, this invention relates to cascaded multi-stage converters wherein each stage develops a corresponding part of the final digital output signal. The embodiments described hereinbelow utilize converter stages of the parallel type.

2. Brief Description of the Prior Art

Parallel or "flash" converters of various designs have been available for some time, and have speed of conversion as their principal goal. Conventional designs of this type for developing high-resolution outputs, such as 8 or 10 bits, have the disadvantage of requiring considerable circuitry, especially including a large number of comparators with associated logic. One approach to reducing the number of comparators is shown in U.S. Pat. No. 4,270,118 (Brokaw).

Still another design approach is to employ a successive series of stages (or cycles of operation) each arranged to develop a digital output of limited scope, e.g. 3 bits, and to produce from each stage (or cycle of operation) an analog residue signal as the input for the next stage (or cycle). In this way, a high-resolution output can be developed by combining the digital outputs of the several stages or cycles, which are sometimes referred to as sub-ranging stages or cycles. An example of this kind of converter is shown in U.S. Pat. No. 4,814,767 (Fernandes et al).

A major limitation of multi-stage ADC architectures results from the need for interstage amplification, particularly when the overall resolution exceeds about 9 bits. Such amplification is for the purpose of raising the residue of one conversion to a level which can be digitized by the next subsequent stage. In present designs, the gain of such amplification must be quite precisely controlled, in order to produce an accurate digital output.

The need for accurate amplification can be understood from consideration of the diagram of FIG. 1. This diagram shows a prior art multi-stage ADC having a first A/D stage 20, a DAC 22, and a summation circuit 24 to produce a residue signal. This residue signal is amplified by an interstage gain block 26 driving a second A/D stage 28. The digital outputs of the two A/D stages are combined to develop the final digital output.

In the system of FIG. 1, the size of one step of the DAC 22, when multiplied by the interstage gain, must exactly match the full-scale range of the second A/D stage. For example, if the complete converter is a 10-bit ADC comprised of a 5-bit DAC and two 5-bit A/D stages, and if the A/D stages have a 2-volt full-scale range, the residue into the interstage gain block 26 will be $\pm 0.5$ LSB at the 5-bit level, or $\pm 1$ V/32=31.25 mV. This must be amplified to provide $\pm 1$ volt full-scale, so a gain of 32 is required. This will provide from the second A/D stage 32 full codes between every threshold of the first stage. If, for example, the gain were only half of that required, there would be only 16 codes available at the second stage, so the converter performance would suffer significantly.

Various techniques have been devised to minimize problems from interstage gain inaccuracies. For example, the prior art has used so-called reference refreshing, error averaging, and self-calibration. Efforts also have been directed to improving gain accuracy, as by laser trimming of amplifier components. However, these techniques have not satisfactorily solved the problem.

SUMMARY OF THE INVENTION

In a preferred embodiment of the invention, to be described hereinbelow in detail, a multi-stage ADC is provided wherein the first stage includes a generally conventional flash converter. This converter produces a digital output representing a set of most significant bits. The output also is directed to a DAC arranged to produce two analog residue signals representing the differences between the analog input signal and the two flash converter thresholds (or "quantization levels") respectively above and below the analog input signal. The sum of these two residue signals is equal to one LSB of the first stage flash converter.

Both of these two residue signals are amplified by respective interstage gain elements. A second flash stage uses the amplified sum of these two residues as its reference signal, thus defining the required full-scale of the second flash stage. The digital output from the second flash stage is developed as a ratio of one of the two residue signals to the sum of the two residue signals, and provides lower order bits to be added to the most significant bits from the first flash stage, to develop the final output signal. The ratio does not change with amplification gain (so long as the two amplifiers are reasonably well matched). Thus this arrangement can provide correct codes regardless of the magnitude of the gain of the interstage amplification.

Accordingly, it is an object of the invention to provide an improved analog-to-digital converter (ADC) of the multi-stage type. Another object of the invention is to provide a multi-stage ADC having superior accuracy, yet capable of high-speed operation. Other objects, aspects and advantages of the invention will in part be pointed out in, and in part apparent from, the following description of a preferred embodiment of the invention considered together with the accompanying drawings.

DESCRIPTION OF A PREFERRED EMBODIMENT

Figure 1:
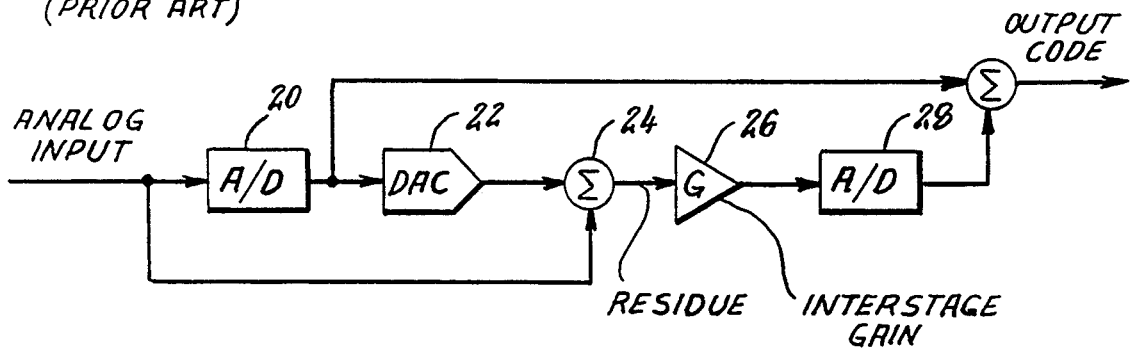
FIG. 1 is a block diagram of a prior art ADC of the multi-stage type.
Figure 2:
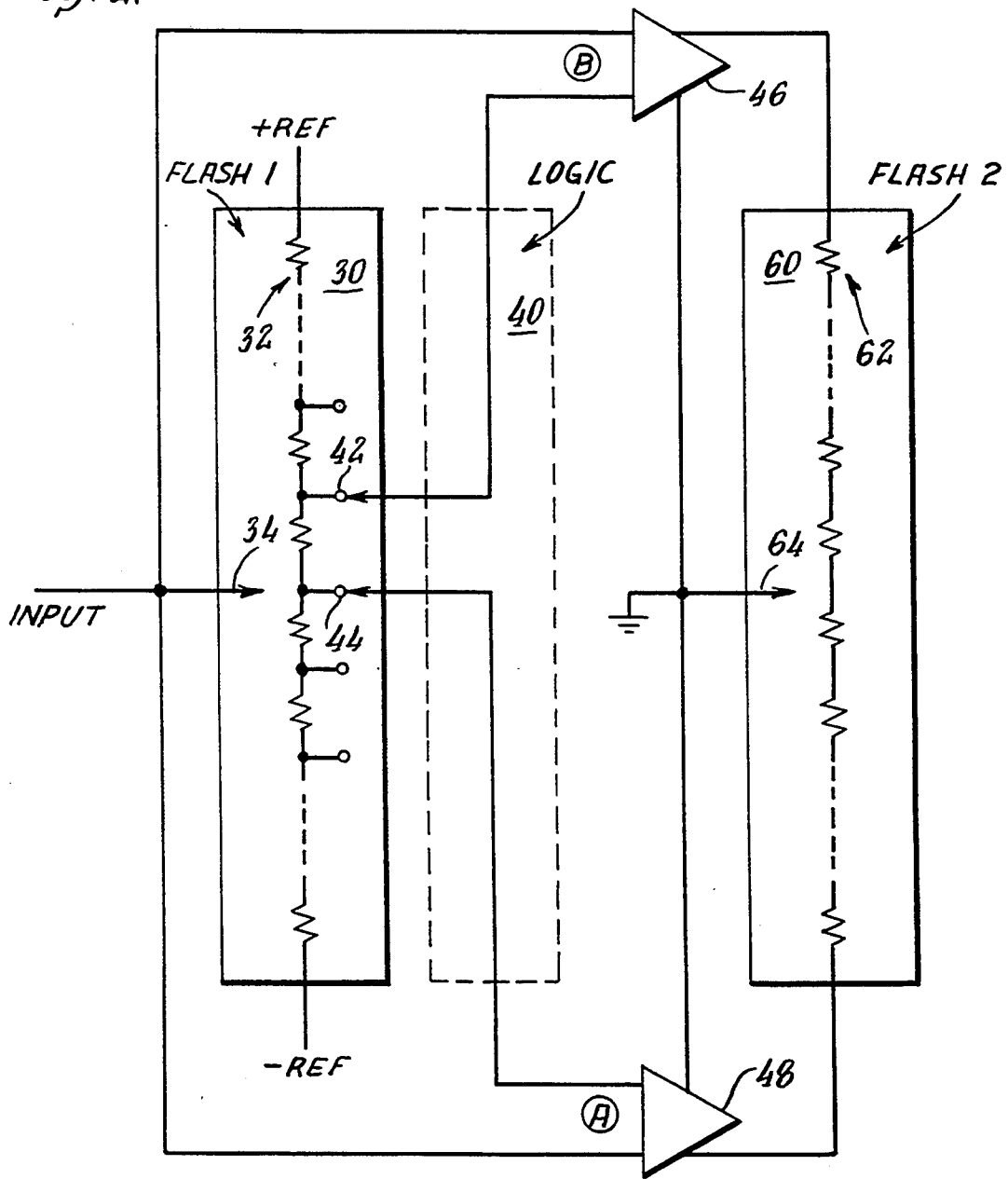
FIG. 2 is a diagrammatic showing illustrating the inventive concept.

Referring now to FIG. 2, there is a diagrammatic showing of a two-stage ADC to illustrate the principles of the present invention. This converter includes a first A/D stage comprising a flash converter 30 of the type including a resistor string 32 supplied at its ends with a reference voltage. The resistors normally are of equal value, although this is not a requirement. The analog input signal is illustrated by the arrow 34 which conceptually can be viewed as being movable up or down the resistor string with change in magnitude, to be positioned at the point where the resistor string voltage is equal to the analog signal.

Logic circuitry 40, using known technology, is provided to make connection to those resistor string nodes (42, 44) the voltages of which are respectively above and below the analog signal magnitude. This logic circuitry can provide a digital output (not shown) in the form of a set of most significant bits corresponding to the value of the lower one of the two threshold levels. The logic circuitry also directs both threshold levels to input terminals of corresponding interstage amplifiers 46, 48. The analog signal is connected to the other input terminals of these amplifiers. The input signal to the lower amplifier 48 can be considered the "normal" residue (A) of the first flash converter, and the input signal to the lower amplifier 48 is a "second" residue signal (B). The combined inputs (A+B) to the two amplifiers is equal to one LSB of the first flash converter 30.

Figure 3:
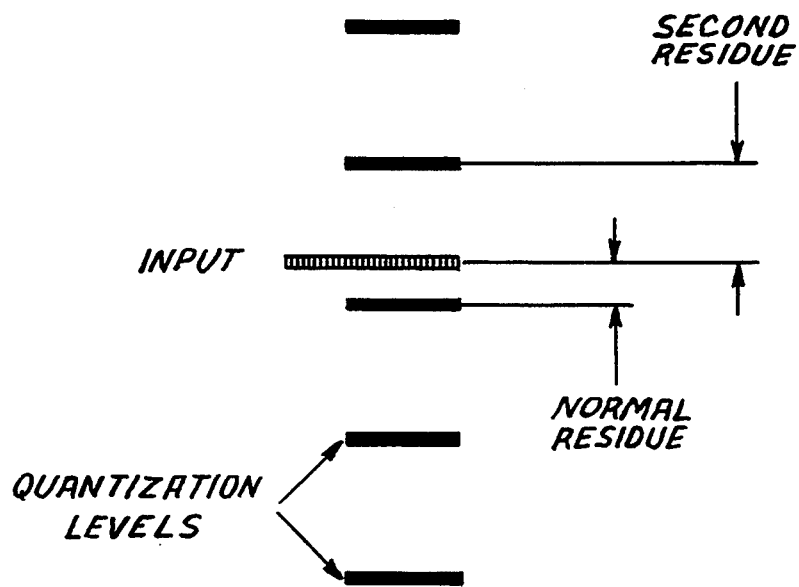
FIG. 3 is a pictorial representation of the functioning of a basic aspect of the invention.
Figure 4A:
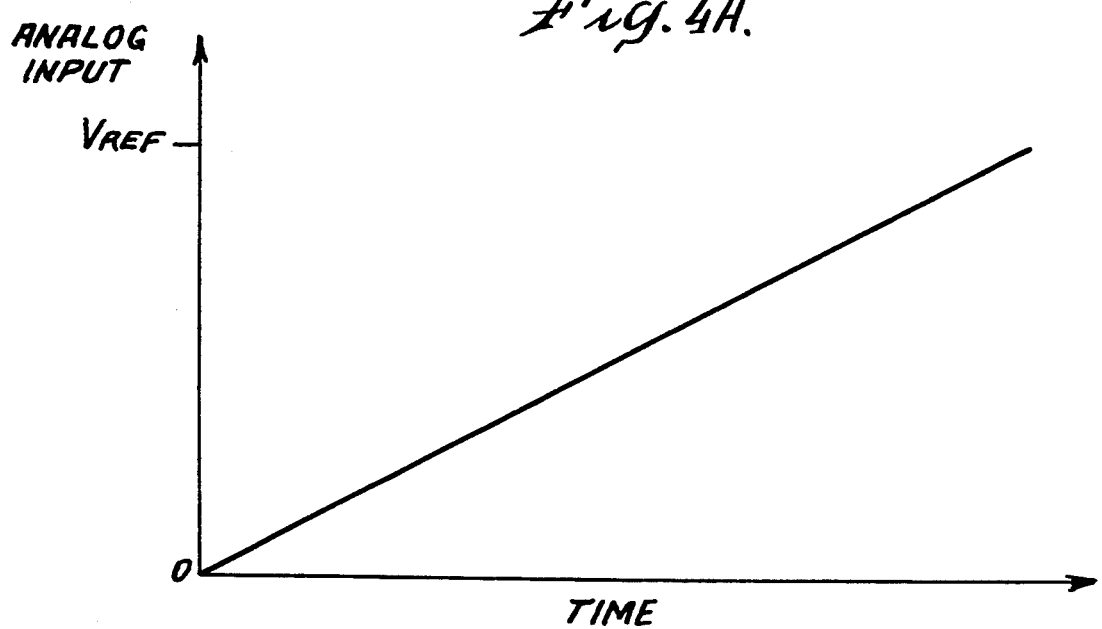
FIGS. 4A, 4B and 4C present graphs showing the way in which the two residue signals vary as the input signal increases as a slow ramp.
Figure 4B:
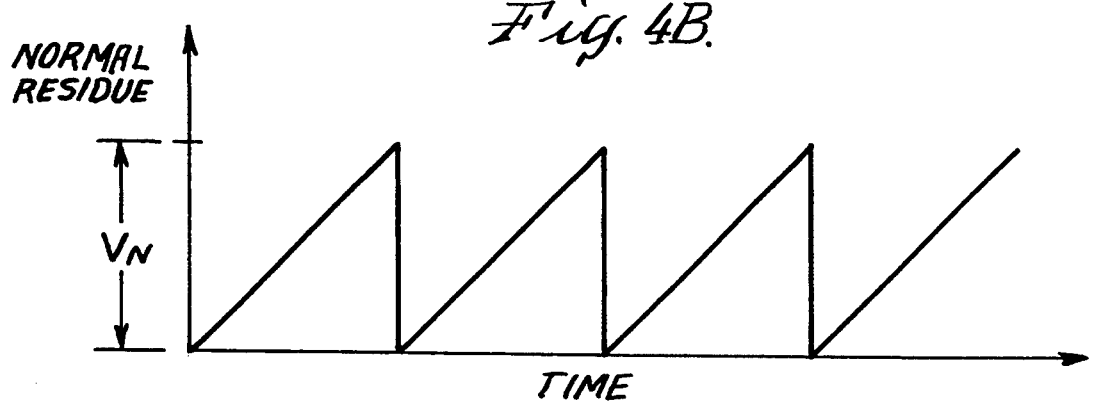
Figure 4C:
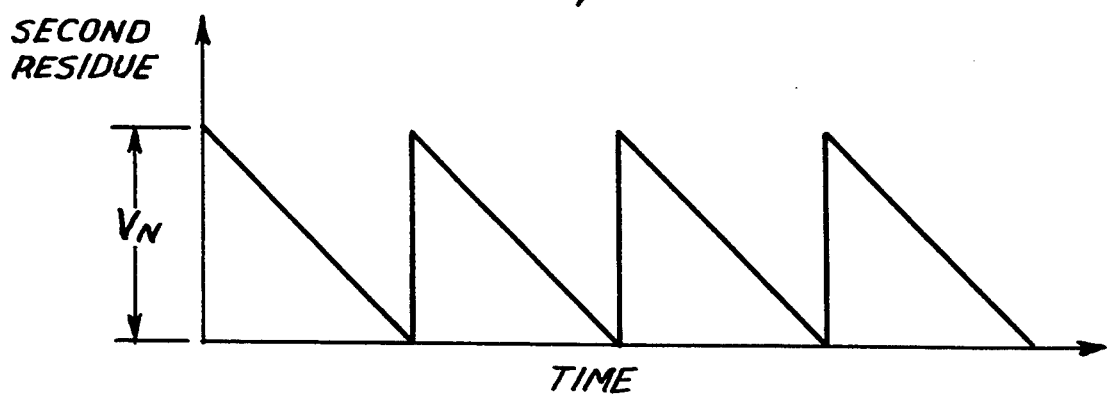

FIG. 3 shows somewhat pictorially the relationship between the input signal and the threshold or "quantization" levels. This presentation shows more explicitly the manner in which the normal and second residue signals are developed. The graphs of FIGS. 4A, 4B and 4C show the manner in which the normal and second residue signals vary as the input signal is swept through its range.

The outputs of the two amplifiers 46, 48 are directed to a second A/D stage comprising a second flash converter 60. The amplifier outputs in effect supply a reference voltage for a resistor string ladder 62. The analog input to this stage is shown as an arrow 64 which, in this implementation, is grounded.

The flash converter 60 produces a set of lower-order (less-significant) bits to be combined with the most-significant bits from the first flash converter 30 so as to develop the total digital output signal. The voltage across the ladder 62 is equal to the sum of the two amplified residues from the first stage. In this implementation, with ground supplied as the input to the ladder, the voltages at the ends of the ladder move up and down together about the grounded input as the input to the first A/D stage varies.

Figure 5:
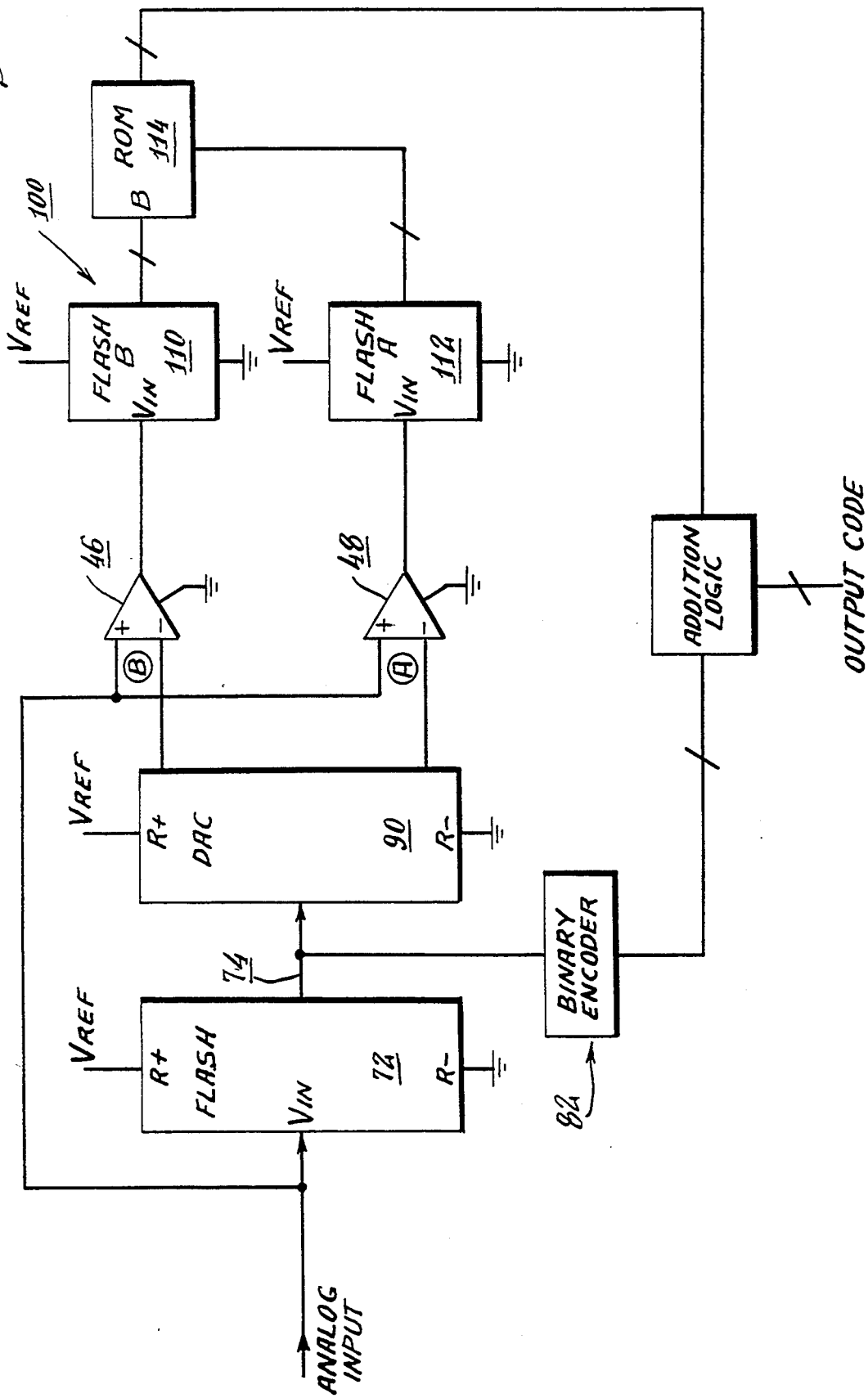
FIG. 5 is a block diagram of a two-stage ADC incorporating the present invention.

Turning now to FIG. 5, there is shown a somewhat more detailed presentation of a two-stage ADC in accordance with the principles of the invention. This converter includes a first A/D stage 70 including a flash converter 72 which receives the analog input and produces a multi-bit digital output on a bus 74. A reference voltage R is supplied to this converter for comparison with the analog signal Vin.

Figure 6:
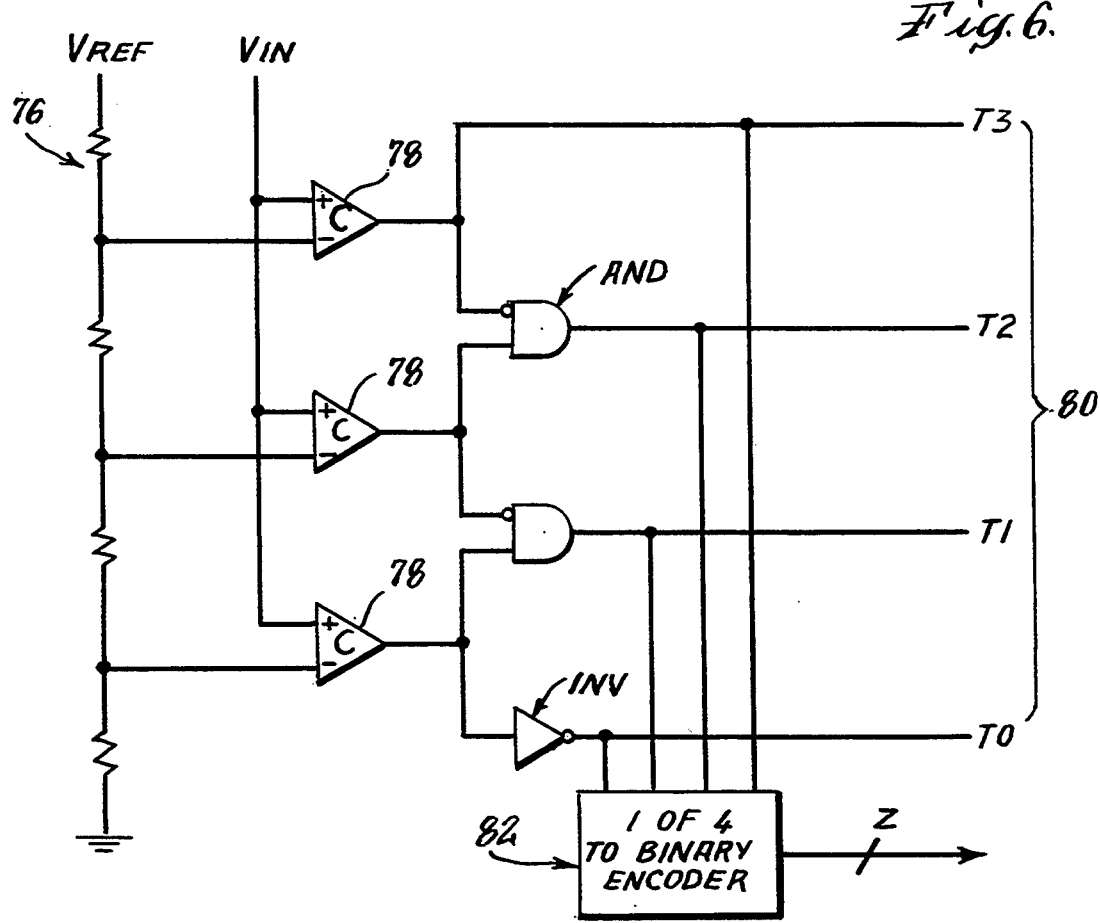
FIG. 6 shows details of a first flash converter for the ADC of FIG. 5.

FIG. 6 illustrates one possible implementation for this flash converter 72, including a resistor ladder 76 the nodal voltages of which are supplied to comparators 78 together with the analog input. In this arrangement, the digital output is developed as a "1-of-4-code" on lines 80 ($T_0$–$T_3$), only one of which will be high for any given input signal. Although four possible outputs are shown, it will be understood that this is for illustration only, and that as a practical matter higher resolutions would be employed. The digital signal on lines 80 is directed to a "1-of-4 to binary" encoder 82 which (in this illustration) produces a 2-bit digital signal as a set of most significant bits of the final output signal.

Figure 7:
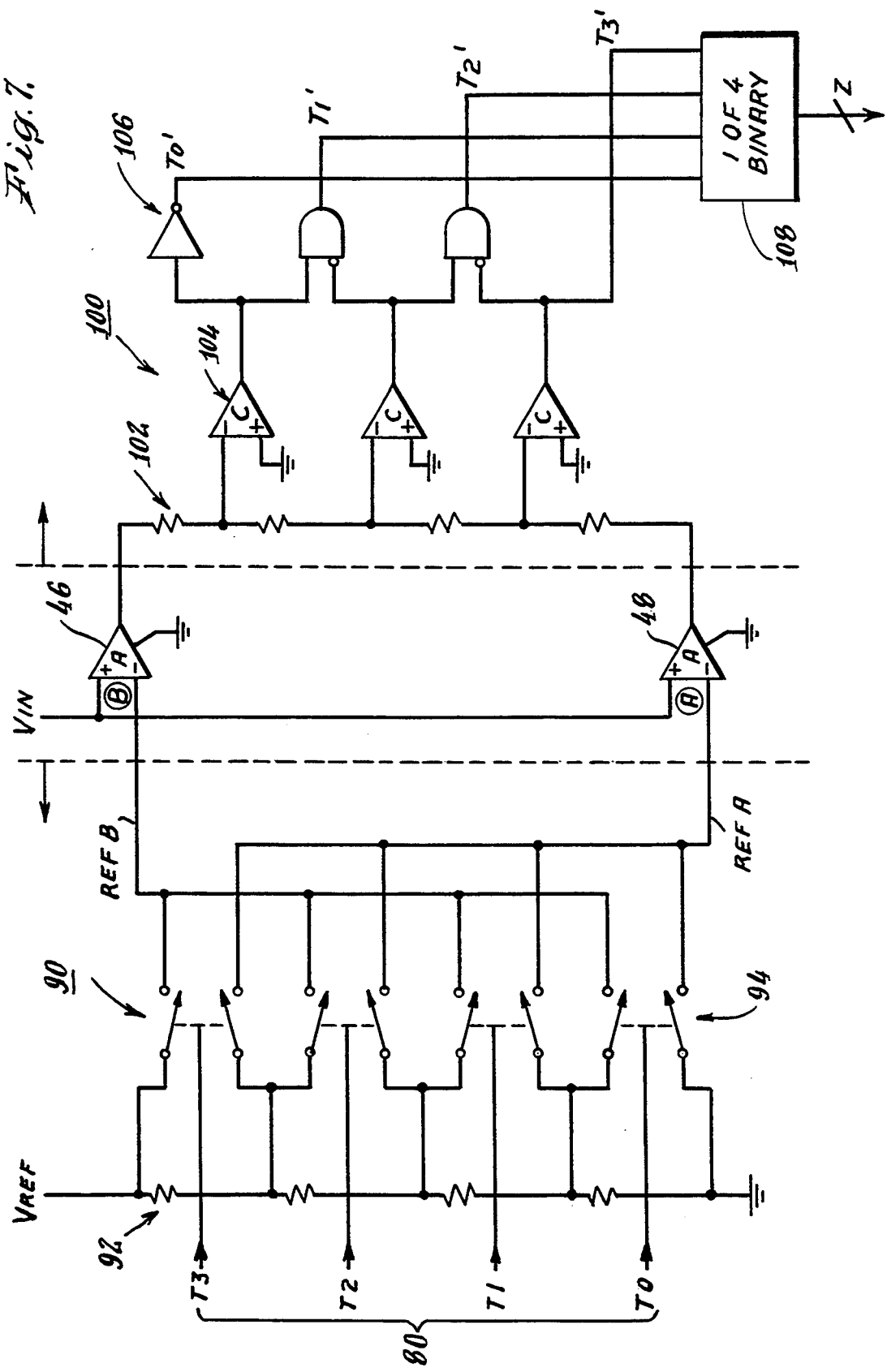
FIG. 7 shows details of a DAC and second A/D stage operable with the flash converter of FIG. 6.

The output lines 80 also are connected to a DAC 90 which (referring now to FIG. 7) may include another resistor ladder 92 (e.g., identical to ladder 76) the nodal voltages of which are directed to logic switches 94 controlled by the digital signal of lines 80. Whenever a line $T_0$–$T_3$ goes high, the corresponding pair of switches is closed to establish connections from the adjacent nodes to the amplifier inputs. These logic switches select the two nodal voltages which are above and below the analog input signal, and connect those nodal voltages to respective amplifiers 46, 48 (as in FIG. 2). The analog signal also is connected to the input of these amplifiers 46, 48, and the amplifier outputs, i.e., the amplified residue signals, are directed to a second A/D stage 100 including a second resistor ladder 102.

Figure 8:
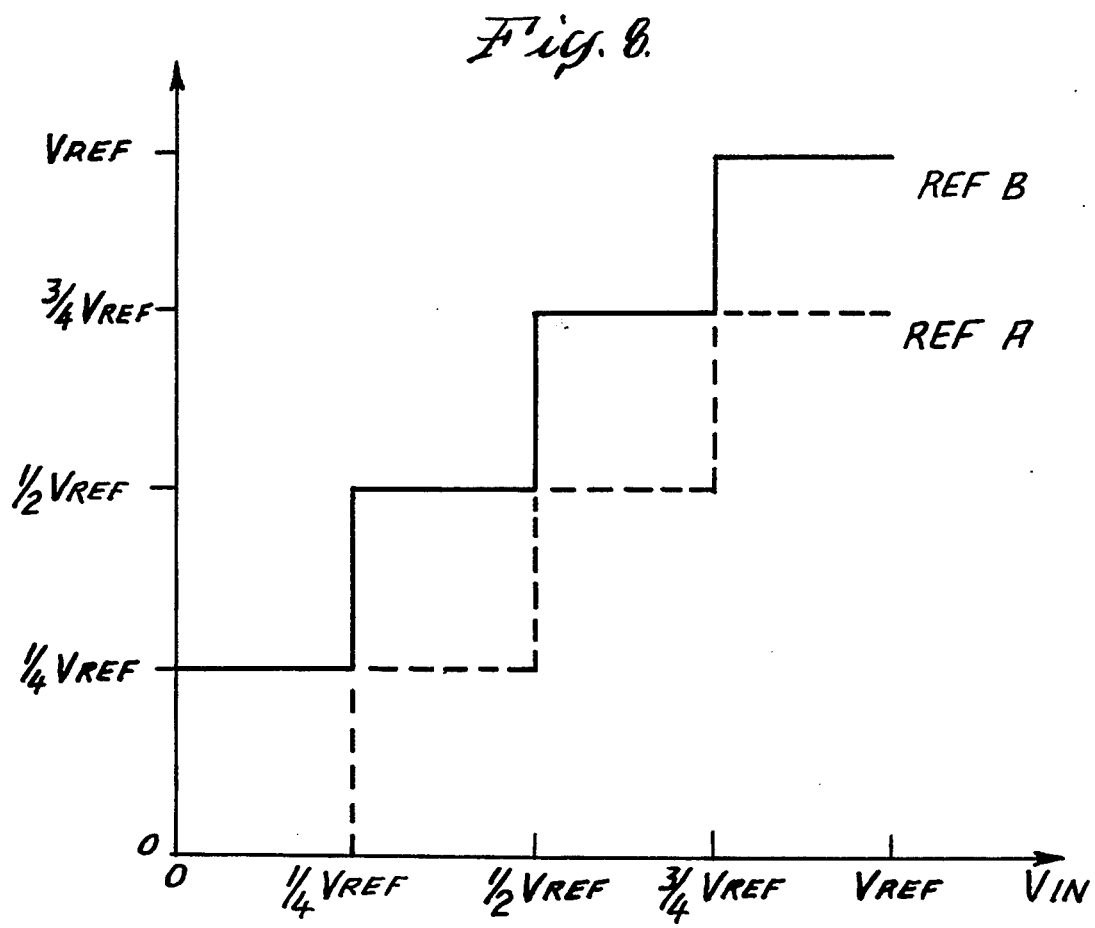
FIG. 8 is a graph showing how the reference voltages for the interstage amplifiers vary with changes in input signal.
Figure 9:
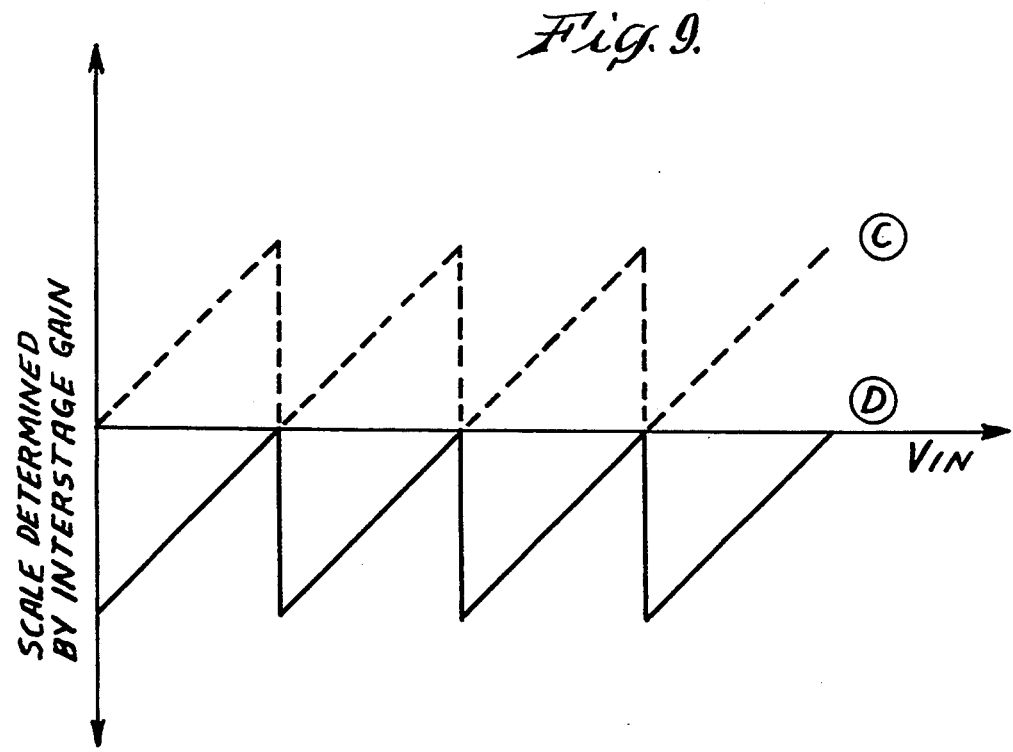
FIG. 9 is a graph showing how the amplified residue signals vary with changes in input signal.

The graphs of FIGS. 8 and 9 show the relationships of the signal outputs (REF A and REF B) from the switches 94, and the amplified residue signals (C and D) from the amplifiers 46, 48, as the analog input varies from zero to full-scale. The amplified residue signals (C and D) are connected to the ends of the resistor ladder 102. This arrangement is somewhat in the nature of the implementation of FIG. 2.

The amplified residue signals connected to the ladder 102 are referenced to ground in the amplifiers. Comparators 104 are connected respectively to the ladder nodes, and also are referenced to ground. The comparator outputs are connected to logic circuitry 106 to produce a "1-of-4" digital output ($T_0'$–$T_3'$) representing the residue from the first A/D stage 70. These lines are connected to a "1-of-4 to binary" encoder 108 to produce a set of less-significant bits for the final digital signal, to be combined with the most-significant bits from the previous stage.

The embodiment of FIG. 5 employs an alternative decoding arrangement for the second A/D stage 100. In FIG. 5, the outputs of the interstage amplifiers 46, 48 are directed to respective flash converters 110, 112 of conventional design. These converters produce digital signals corresponding to the respective amplified residue signals. These digital signals are of the "one line high" type, as in the outputs of the first A/D stage 70, and are directed to respective inputs A and B of a matrix memory device 114. In this embodiment, the matrix device is a ROM including a series of digital memory cells individually accessed in response to corresponding pairs of digital input signals A and B.

Figure 10:
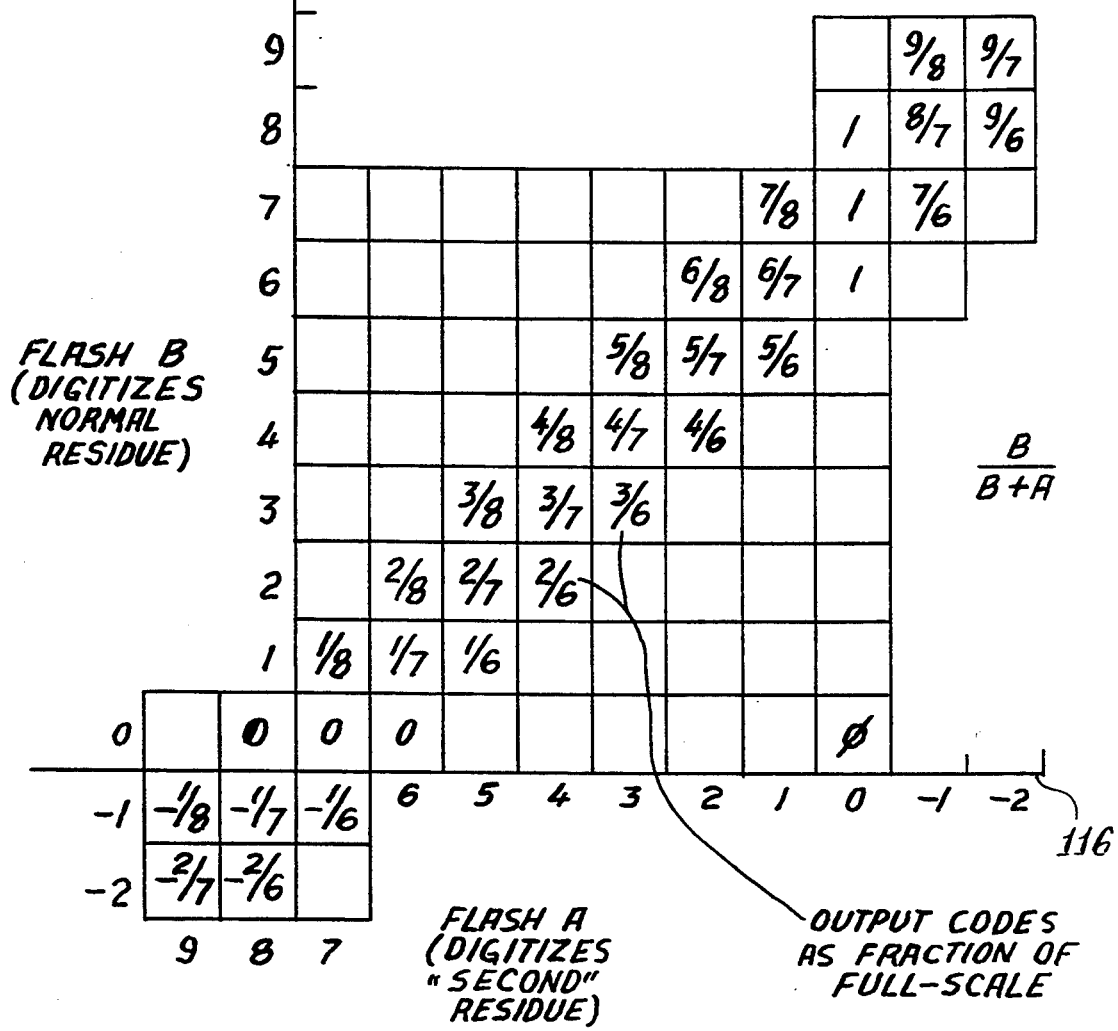
FIG. 10 shows a ROM matrix.

FIG. 10 illustrates how the memory of the ROM 114 is structured. Along the horizontal base line 116 are the input terminals for the lines from the lower flash converter 112. The inputs from the other flash converter 110 are connected to corresponding terminals along the vertical side 118. The memory cells include pre-stored digital numbers corresponding to the ratio of B/(A+B) for the particular pair of "high" lines connected at inputs 116 and 118, i.e. the ratio of one residue signal B to the sum of the residue signals (A+B).

This ratio, when developed in digital format, provides the less-significant bits to be produced by the second A/D stage 100. That is, output codes selected from the ROM 114 represent in digital format the size of the normal residue signal as a fraction of the full-scale range of the second A/D stage 100. Expressed in another way, the digital signal selected from the ROM 114 represents the size of the normal residue signal as a fraction of one LSB of the previous A/D stage 70.

The number of inputs to the matrix ROM 114 as shown in FIG. 10 will correspond to whatever number of one-line-high digital outputs are produced by the two flash converters 110, 112. Also, as a practical matter, additional inputs will be provided, as identified by negative numbers, in order to accommodate an extended flash range beyond full scale. Such extended range, sometimes referred to as overlap, or over-range, often is useful in error correction; see, for example, the above-mentioned U.S. Pat. No. 4,814,767. It also may be noted that not all of the matrix cells need have digital codes. As a practical matter, only a limited band of such cells need be accessed, as required to accommodate a realistic degree of inaccuracy in gain of the interstage amplification.

Figure 11:
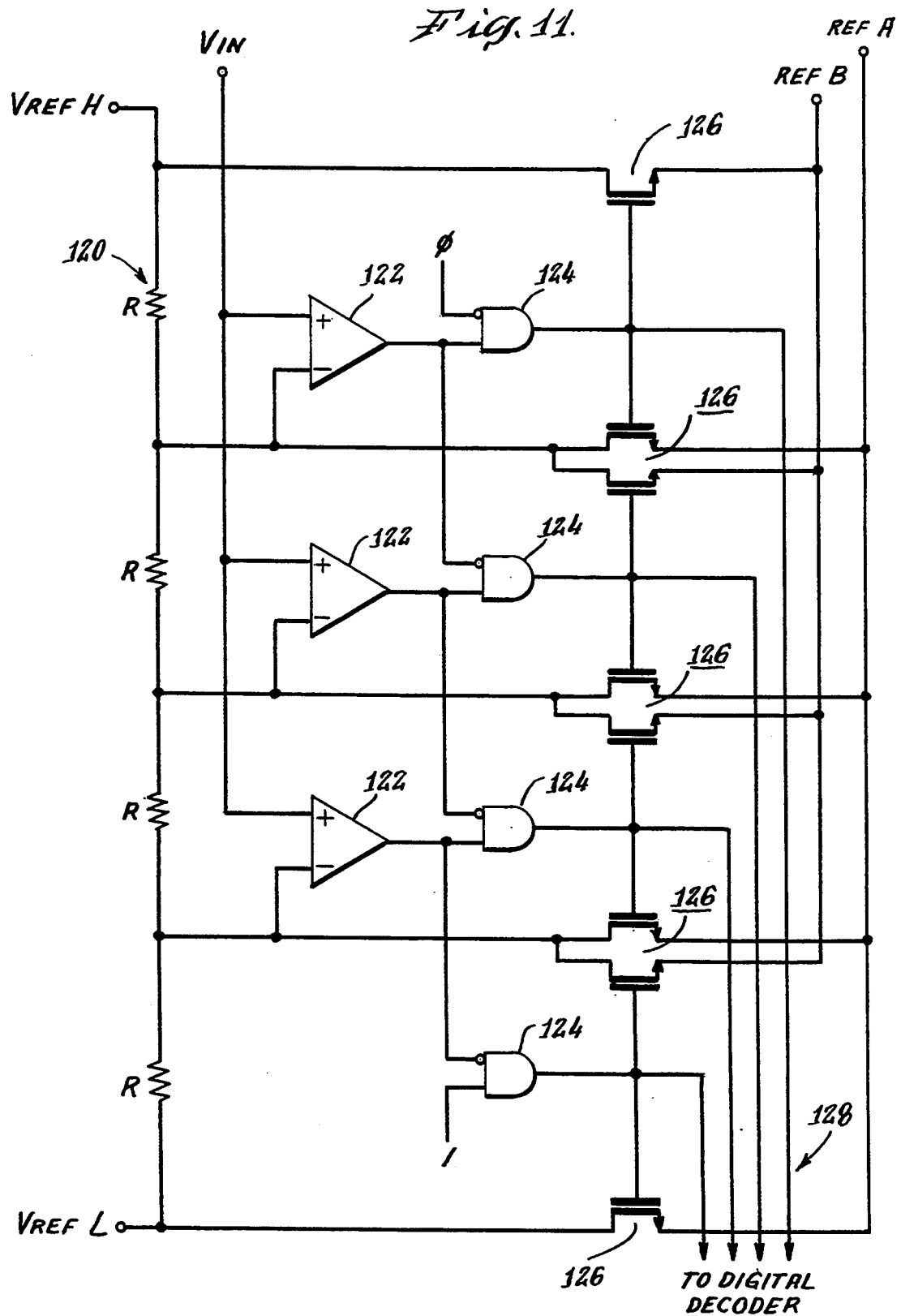
FIG. 11 shows a circuit which merges the flash and DAC portions of the first stage of the converter of FIG. 5.

An alternative arrangement for the first A/D stage 70 is shown in FIG. 11. Here the function of the initial flash converter 72 (FIG. 5) and the following DAC 90 are merged into one circuit, having a single reference resistor ladder 120. The reference levels from the ladder are compared with the analog signal by a set of comparators 122. The resulting comparator outputs are directed to a set of AND gates 124 which control MOS switches 126 to connect to the output lines REF A and REF B the pair of adjacent ladder nodes which are below and above the magnitude of the analog input signal. The gate outputs also are connected to a set of four lines 128 which lead to a digital encoder, as in the FIG. 5 embodiment.

It may be noted that the disclosed embodiments comprise only two A/D stages. However, the invention is applicable to converters including three or more stages in cascade, and important advantages have been found to accrue from such additional cascading.

Although specific preferred embodiments of the invention have been described hereinabove in detail, it is to be understood that this is for the purpose of illustrating the principles of the invention, and should not be considered limiting since it is apparent that one skilled in this art can make many modifications to the disclosed embodiments. For example, although the disclosed embodiments utilize two residue signals, in certain applications it can be advantageous to derive and make use of more than two residue signals. Also, although resistor-string flash converters have been shown, advantages can be obtained through the use of other types of converters, such as those using capacitor networks. Still other variations will be apparent to those skilled in this art.

What is claimed is:

1. A multi-stage A-to-D converter, comprising:
a first A/D stage-arranged to receive an analog input signal to be converted to a first digital signal;
first reference signal means for said first stage arranged to produce a set of reference signal levels of different magnitudes;
means associated with said reference signal means to provide for producing said first digital signal of at least one most-significant bit responsive to the value of said analog input signal;
residue means for developing at least first and second residue signals representing, respectively, the differences between said analog input signal and two of said reference levels;
a second A/D stage for producing a second digital signal comprising at least one bit of less significance than said most-significant bit corresponding to at least one of said residue signals;
said second A/D stage including means responsive to both said first and said second residue signals for developing said second digital signal.

2. A converter as claimed in claim 1, including interstage amplifying means for amplifying said residue signals.

3. A converter as claimed in claim 1, including first and second amplifiers having inputs responsive to said first and second residue signals and producing amplified outputs corresponding thereto;
an impedance network responsive to the outputs of said two amplifiers for producing a set of progressively-increasing second reference signals; and
comparator means having inputs connected respectively to said set of second reference signals and operable to produce outputs for developing said second digital signal.

4. A converter as claimed in claim 3, wherein said impedance network comprises a series-connected string of impedance elements;
the outputs of said two amplifiers being connected at opposite ends of said string of elements respectively.

5. A converter as claimed in claim 1, wherein said first reference signal means includes a series-connected string of impedance elements;
first and second amplifiers;
means for connecting one input terminal of each amplifier to respective adjacent nodes of said string which provide signal levels above and below said analog signal;
means for connecting the other input terminals of said amplifiers to said analog signal;
the outputs of said amplifiers producing signals corresponding to said first and second residue signals for developing said second digital signal.

6. A converter as claimed in claim 5, including a second series-connected string of impedance elements connected between the outputs of said first and second amplifiers to serve as second reference signal means-for developing said second digital signal.

7. A converter as claimed in claim 6, wherein said second A/D stage comprises a set of comparators; and means connecting one input of each comparator to a corresponding node of said second string of impedance elements.

8. A converter as claimed in claim 7, wherein the other inputs of said comparators are connected to a reference potential.

9. The method of converting an analog signal to a corresponding digital signal comprising;
directing the analog signal to a first A/D stage for producing at least one most significant bit;

developing first and second analog residue signals representing the differences between said analog signal and first and second reference levels;

said two residue signals being so developed that the difference there between corresponds to one least significant bit of said first A/D stage; and operating a second A/D stage to produce at least one less-significant bit representing a magnitude responsive to a relationship between said analog residue signals.

10. The method of claim 9, wherein said most-significant bit is produced by a flash converter.

11. The method of claim 10, wherein said less-significant bit is produced by a flash converter.

* * * * *